United States Patent [19]

Block et al.

[11] Patent Number: 5,513,073
[45] Date of Patent: Apr. 30, 1996

[54] OPTICAL DEVICE HEAT SPREADER AND THERMAL ISOLATION APPARATUS

[75] Inventors: Timothy R. Block; David P. Gaio; Charles J. Guenther, all of Rochester; Dennis L. Karst, Kasson; Thomas D. Kidd, Stewartville; Michael W. Leddige, Rochester, all of Minn.

[73] Assignee: International Business Machines Corporation, Armonk, N.Y.

[21] Appl. No.: 228,972

[22] Filed: Apr. 28, 1994

[51] Int. Cl.⁶ ..................................... H05K 7/20
[52] U.S. Cl. .................. 361/719; 257/724; 361/704; 361/785; 385/114
[58] Field of Search .................. 439/61, 65, 67, 439/77; 385/100, 101, 114; 165/80.3, 185; 257/706, 707, 712, 713, 717–719, 723–724; 361/784, 785, 789, 807, 809, 688, 689, 704, 707, 711, 714, 718, 719, 722, 749, 789

[56] References Cited

U.S. PATENT DOCUMENTS

| | | |
|---|---|---|
| 4,085,502 | 4/1978 | Ostman et al. . |
| 4,812,135 | 3/1989 | Smith . |
| 5,069,522 | 12/1991 | Block .......................................... 385/39 |
| 5,077,637 | 12/1991 | Martorana et al. . |
| 5,168,430 | 12/1992 | Nitsch .................................... 361/749 |
| 5,251,095 | 10/1993 | Miller ..................................... 361/694 |
| 5,280,191 | 1/1994 | Chang ..................................... 257/112 |
| 5,353,192 | 10/1994 | Nordin .................................... 361/700 |

FOREIGN PATENT DOCUMENTS

| | | |
|---|---|---|
| 0535473A1 | 4/1993 | European Pat. Off. . |
| 3162029 | 12/1991 | Japan . |
| 2086074 | 5/1982 | United Kingdom . |

OTHER PUBLICATIONS

IBM Technical Disclosure Bulletin, vol. 32, May 1990, (Anonymous) "Gigabit Opto–Electronic Package Using Extended MCP Substrate" pp. 129–131.

*Primary Examiner*—Gerald P. Tolin
*Attorney, Agent, or Firm*—Andrew J. Dillon

[57] ABSTRACT

Attachment of electronics to optical devices is made by supporting the optical devices on a heat spreader card and the electronics on a separate circuit card. Each card has at least a first major surface, with an optical transducing subassembly mounted perpendicularly from the major surface of the heat spreader card. Electronics, except for transducing elements, are placed on the circuit card. The only direct attachment between the circuit card and the heat spreader card is one or more flexible cables attached to the respective major surfaces. This arrangement mechanically isolates the circuit card from the heat spreader card. The flexible cables include electrical conductors held positionally in a polyimide matrix, which provides for thermal isolation of the heat spreader card and the circuit card.

14 Claims, 4 Drawing Sheets

OPTICAL DEVICE HEAT SPREADER AND THERMAL ISOLATION APPARATUS

BACKGROUND OF THE INVENTION

1. Technical Field:

The invention relates to apparatus for the connection of optical and electrical devices and more particularly to an attachment mechanism for use between an electronic circuit board and optical cable.

2. Description of the Related Art:

An optical link card for an electronic data processing system must provide for conversion between parallel electronic data and serial optical data in two directions. A serializer converts the data to be transmitted from a parallel format to a serial format. Then a laser in an optical subassembly converts the serial electrical pulses to optical pulses. Data received over an optical link is convened to electrical pulses and then applied to a deserializer to place it in parallel format. The complication caused by conversion of the data between electrical and optical formats is more than offset by the boost in data transmission capability afforded by use of high speed optical data transmission channels.

Optical link cards should exhibit a high degree of standardization and be readily incorporated into a number of platforms, particularly personal computers or workstations. As may be expected, a number of problems can occur when this is done. Packaging electrical and optical components together exposes the optical devices to the heat output of the electrical devices. Optical components such as lasers are highly heat sensitive. Placement of the card in a workstation can reduce airflow around the card impeding cooling. Mechanical strain may be placed on pins of the circuit board where it connects to a motherboard within the computer. Also, most circuit boards used for connection to external cables use edge mounted connections to the circuit board. However, edge mounting is not a practical arrangement for optical subassemblies.

Additionally, the high speed data rates make impedance matching between electronic circuitry and the optical subassemblies an important consideration.

SUMMARY OF THE INVENTION

It is an object of the invention to provide for the connection of optical and electrical devices.

It is another object of the invention to provide a connection mechanism for use between an electronic circuit board and an optical cable.

It is still another object of the invention to provide for mutual thermal and mechanical isolation of optical and electrical components while providing an interface between a data processing system and a optical data channel.

It is yet another object of the invention to provide for close impedance matching for channels between transducers of the optical subassemblies and the electronic circuitry.

The above and other objects are achieved as is now described. The invention provides for electronics to optical device attachment by supporting optical devices on a heat spreader card and electronics on a separate circuit card. Each card has at least a first major surface, with an optical transducing subassembly mounted perpendicularly from the first major surface of the heat spreader card. Electronics, except for transducing elementS, are placed on the first major surface of the circuit card. The only direct attachment between the circuit card and the heat spreader card is one or more flexible cables attached to the respective first major surfaces. This arrangement mechanically isolates the circuit card from the heat spreader card. The flexible cables include electrical conductors held positionally in a polyimide matrix, which provides for thermal isolation of the heat spreader card and the circuit card and provides proper impedance matching.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Figure 1:
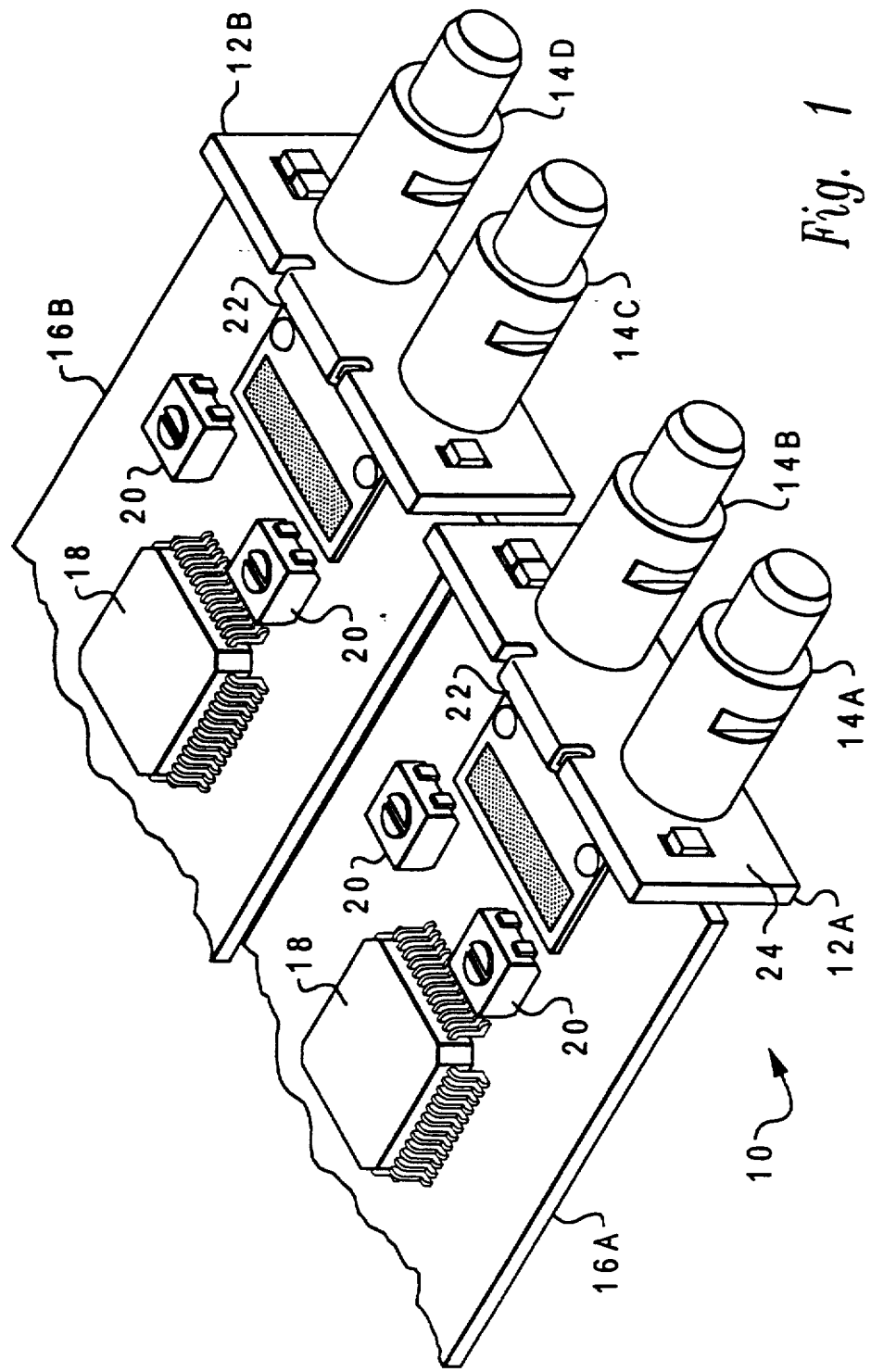
FIG. 1 is a perspective view of an optical device heat spreader and isolation device.

FIG. 1 is a partial front perspective view of an electronics to optical connection mechanism 10. Connection mechanism 10 has a pair of heat spreader cards 12A and 12B supporting 4 optical subassemblies 14A, 14B, 14C and 14D. Optical subassemblies come in pairs with one subassembly each of the pair providing for transmitting data and the other for receiving data upon connection to fiber optic cables (not shown). A transmitting optical subassembly includes a laser which may be pulsed on and off to send a signal out over an optical cable. A receiving optical subassembly may be built with any one of a number of light sensitive elements. Electronic components such as serializers 18 and potentiometers 20, used for converting data from parallel formats used within a host data processing system (not shown) to serial formats used with optical data channels, are disposed on a pair of electronics circuit boards 16A and 16B.

Circuit boards 16A and 16B and heat spreaders 12A and 12B are of conventional epoxy-glass laminate construction. Each heat spreader is attached to an associated circuit board by a dual flexible cable 22. Dual flexible cable 22 connects to heat spreader card 12 over an upper edge of heat spreader 12 and onto a major surface 24 of the heat spreader card. Flexible cables 22 extend across major surface 24 and take positions between optical subassemblies 14A–14D and major surface 24. Flexible cables are adhesively bonded to the heat spreader card surface and are additionally attached by the wave soldering process whereby solder bonds the optical subassemblies, heat spreader, and exposed copper pads on the flex cable.

Conventional wave-solder techniques are permissible for attaching optical subassemblies 14A–14D to heat spreader card 12. No lead forming or tinning operations are required. Heat spreader card 12 and circuit board 16 are separately testable prior to attachment to one another.

Figure 2:
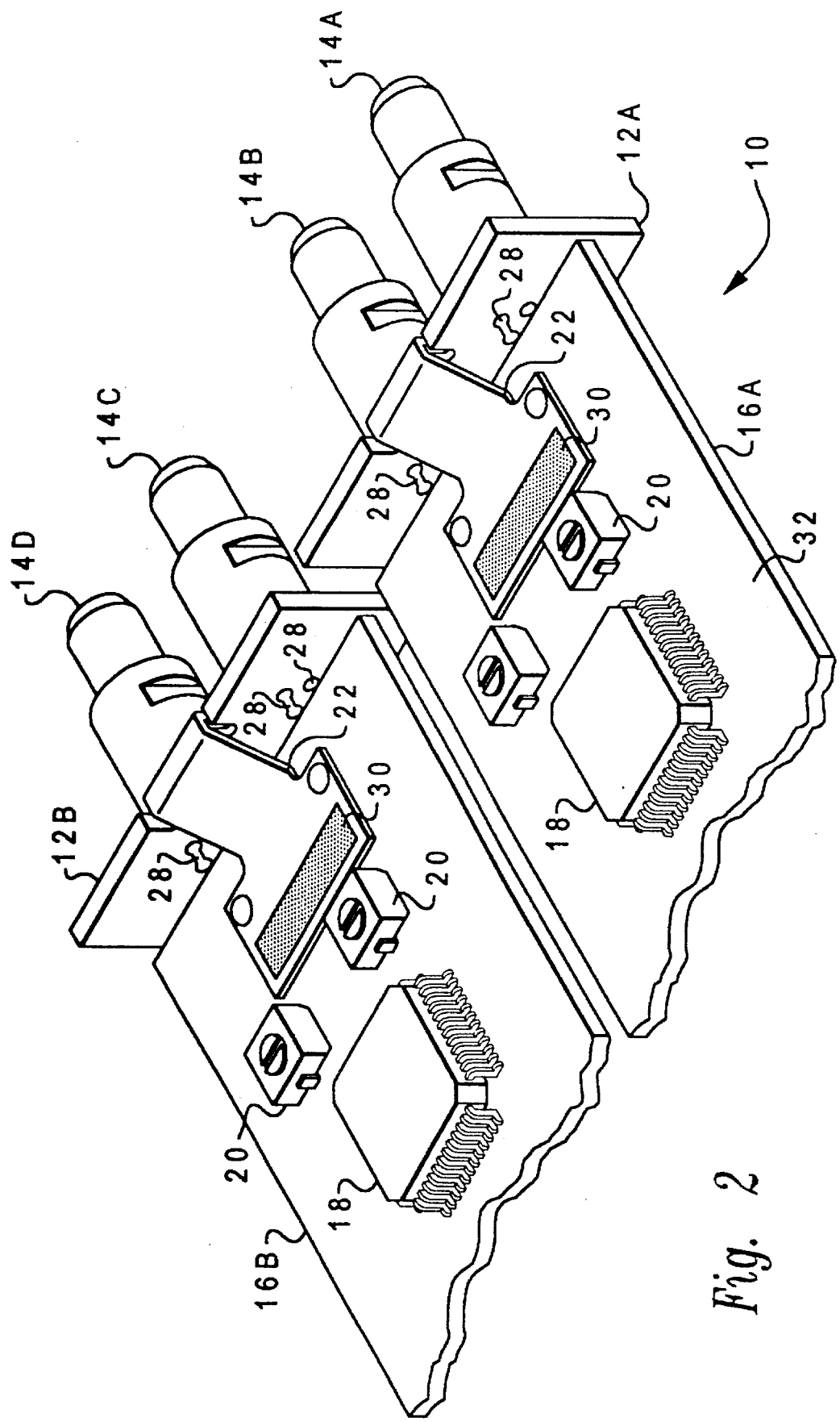
FIG. 2 is another perspective view of the optical device heat spreader and isolation device.
Figure 2:
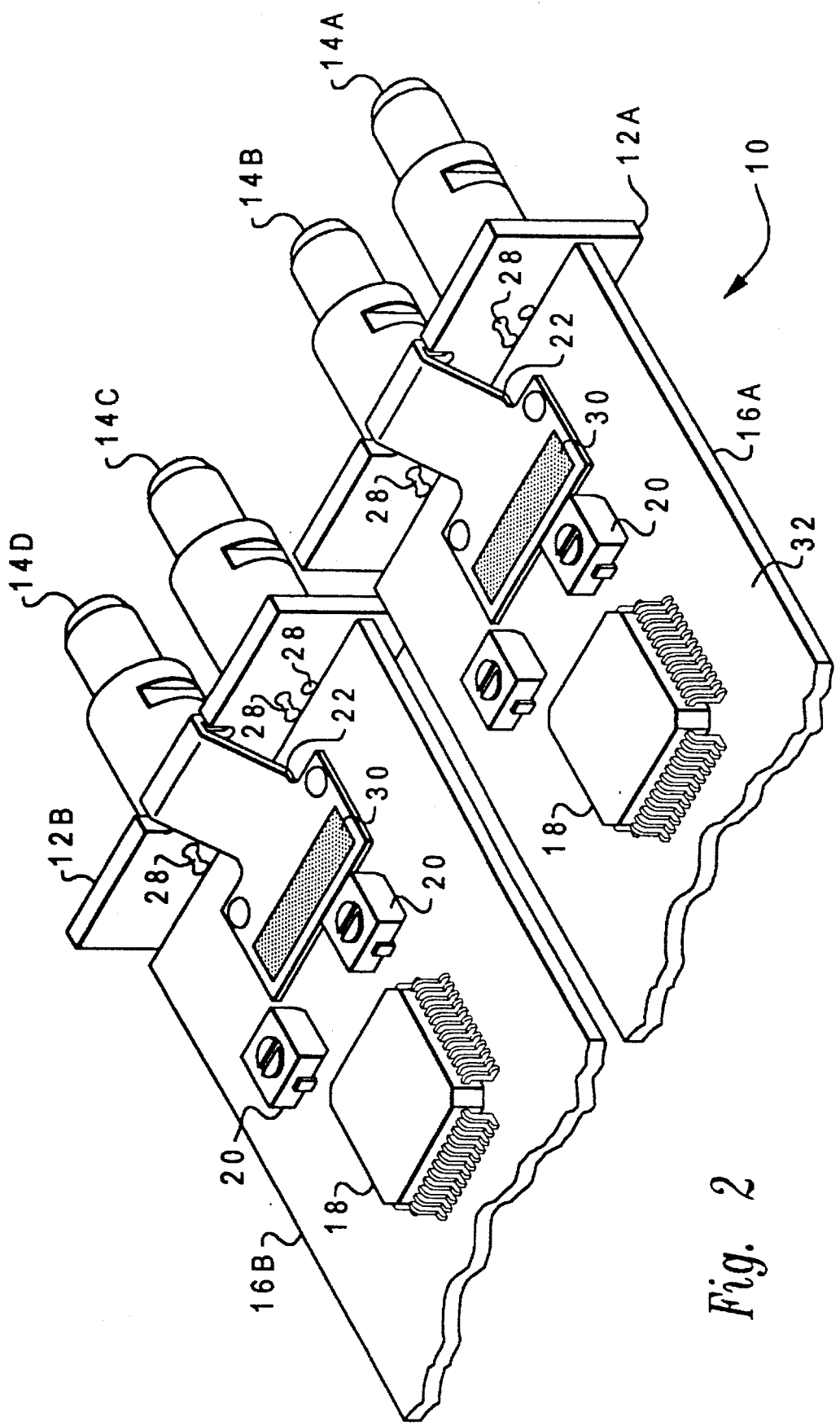

FIG. 2 is a partial rear perspective view of the connection mechanism 10. Dual flexible cable 22 may be seen extending from over the upper edge of heat spreader 12A and then down into contact with circuit board 16A. Flexible cable 22 is brought into essentially planar contact with a major surface 32 of each circuit board 16. A conventional hot bar machine attachment reflows the solder to electrically connect the signal plane of a flexible cable 22 and circuit board 16 at point 30. Hot bar attachment 30 may be made by an automated process for consistently reliable connection and speed in manufacturing.

The first major surfaces of each heat spreader card 12A and 12B and circuit boards 16A and 16B are positioned generally perpendicular with respect to one another to allow installation of the mechanism in a personal computer or workstation. Other orientations may be used if desirable. In a personal computer or workstation installation, circuit board 16A may be conveniently attached to a mother board. Heat spreader 12A may be connected to an exterior face plate with the optical subassemblies 14A–14D facing outward. Mounting a heat spreader card 12A on an exterior face plate allows convenient connection of optical cables to optical subassemblies 14A–14D. In application, additional plastic or metal housings may be used to hold boards 16A and 16B to provide support. These housings, while providing added retention, still allow boards 16A and 16B to float mechanically with respect to the heat spreaders. Flexible cable 22 is preferably the only attachments between heat spreader 12A and circuit board 16A, which allows for loose tolerances in the relative positions of a computer rear panel or face plate and an internal motherboard. Limiting the attachment between heat spreader 12A and circuit board 16A to flexible cable 22 helps to thermally and mechanically isolate the heat spreader and circuit board from one another.

Pins extending from rear faces of the optical subassemblies 14A–14D pass through flexible cable 22 into and through heat spreader 12A to permanently fix the optical subassemblies on the heat spreader. Finned heat sinks may be added to heat spreader 12A, circuit board 16A, or both if desired.

Figure 3:
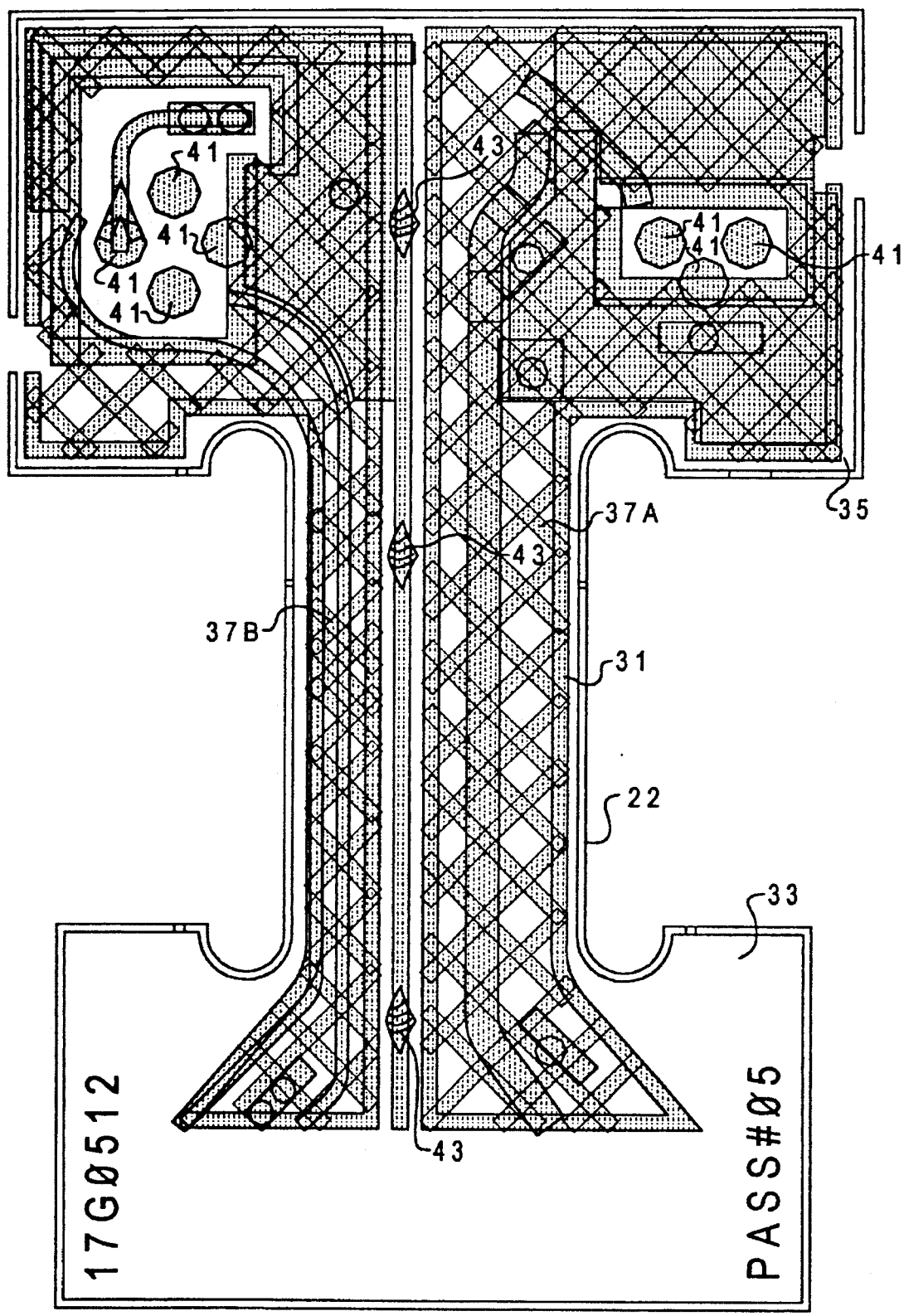
FIG. 3 is a cross sectional view of a ground layer in a flexible cable for attaching a circuit board and a heat spreader card.

FIG. 3 is a cross sectional view of a ground layer 31 of a single flexible cable 22. Flexible cable 22 is a polyimide matrix supporting, in spatially fixed positional relationships, conductive material used to form ground layer 31 and the conductors of a signal layer (shown in FIG. 4). The polyimide matrix of flexible cable 22 gives the cable a high thermal impedance. Because of the high speed data rates used with fiber optic cable, an electrical impedance controlled environment is important for preventing signal degradation in connection apparatus 10. The polyimide matrix for a flexible cable 22 holds the ground plane and signal plane at a fixed distance, making the impedance effects of the ground plane on the signal plane predictable.

Ground plane 31 is provided in the upper of two layers within flexible cable 22. Ground plane 31 comprises copper nets 37A–37B, which extend substantially fully into an end portion 35 and partially into end portion 33. A mesh or net 37 having two parts denoted as 37A, 37B and is used to avoid making flexible cable 22 overly stiff. End portions 35 and 33 are, respectively, for application to major surfaces 24 and 32. A plurality of pads 41 extend into ground layer 31 and are positioned in end portion 35 for connection to pins extending from one of the optical subassemblies 14A–14D. Vias 43 extend from ground plane 31 into the signal plane to provide connection from mesh 37B to conductor 45 for connection to an appropriate conductor on circuit board 16 and to provide isolation between transmit and receive circuitry.

Figure 4:
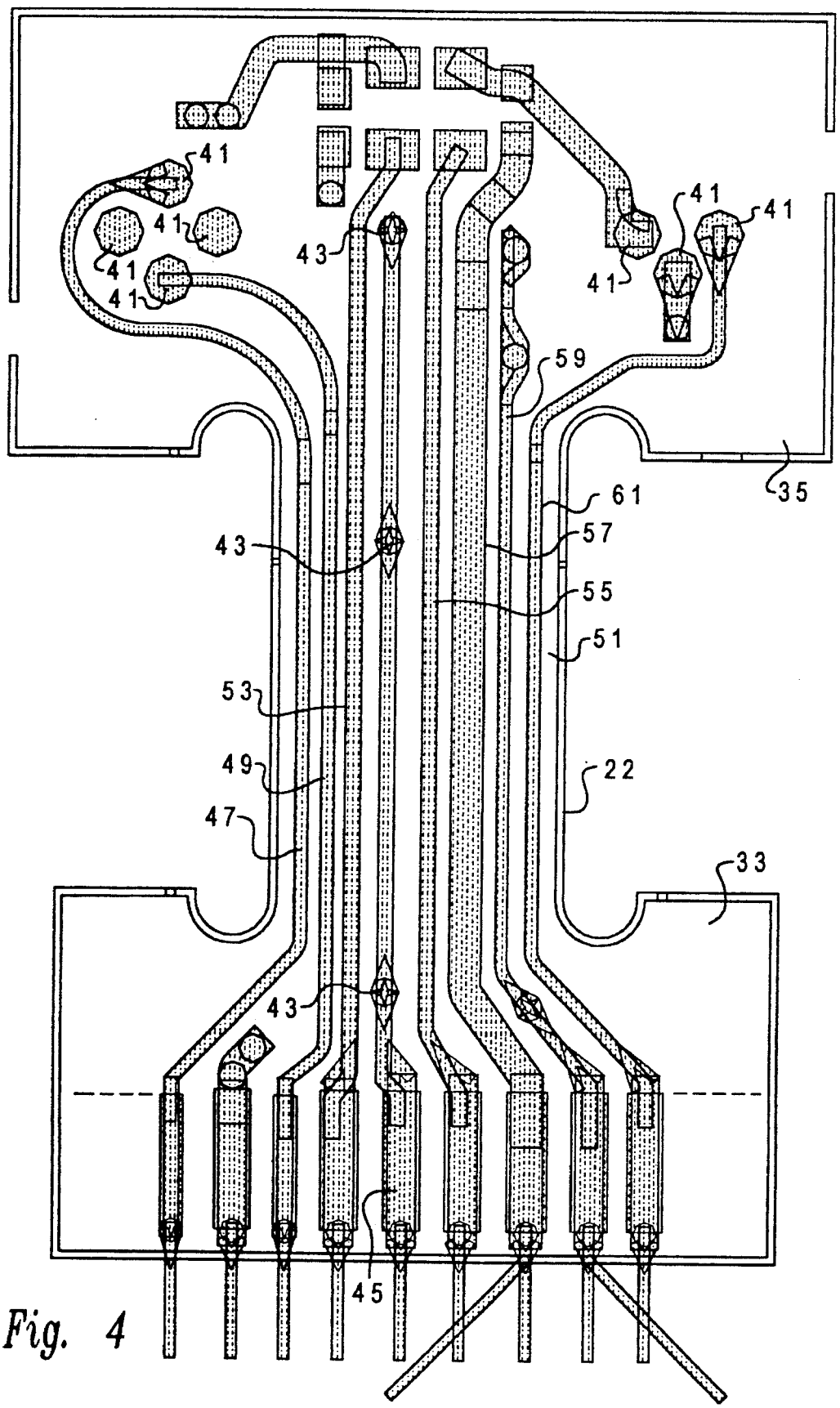
FIG. 4 is a cross sectional view of a signal layer in a flexible cable for attaching a circuit board and a heat spreader card.

FIG. 4 is a cross sectional view of a flexible cable 22 which illustrates a lower signal layer 51. Signal layer 51 includes a plurality of signal conductors 45, 47, 49, 53, 55, 57, 59 and 61. Each of the conductors ends in a tab in end portion 33 into which a hot bar connection is made. Conductors 47, 49, 53, 55, 57, 59 and 61 are varied in width to provide the desired signal impedance.

The present invention provides relief from stresses which are transmitted by a mechanically rigid mount for the optical subassemblies as well as stresses resulting from plugging and unplugging of optical cables to the optical subassemblies and any additional housings. It also allows for devices with more than three leads to be easily attached. A controlled impedance environment is provided right up to the optical subassemblies. Thermal isolation between heat producing electronic devices and heat sensitive optical subassemblies is preserved.

While the invention has been particularly shown and described with reference to a preferred embodiment, it will be understood by those skilled in the art that various changes in form and detail may be made therein without departing from the spirit and scope of the invention.

What is claimed is:

1. Apparatus comprising:
   a heat spreader card having a major surface and an opposite surface;
   an optical transducing subassembly mounted to the major surface of the heat spreader card;
   a circuit card for supporting electronics; and
   a flexible cable attached to the major surface of the heat spreader card, routed to the opposite surface of the heat spreader card via a slot within the heat spreader card and attached to the circuit card, providing the sole direct mechanical attachment between the heat spreader card and the circuit card.

2. The apparatus of claim 1, wherein the flexible cable electrically connects the optical transducing subassembly on the major surface of the heat spreader to the circuit card.

3. The apparatus of claim 2, and further comprising:
   a hot bar attachment between the flexible cable and the circuit card.

4. The apparatus of claim 3, wherein the flexible cable connects directly to the optical subassemblies and provides a controlled impedance signal path between the electronics supported by the circuit card and the optical subassemblies.

5. The apparatus of claim 4, wherein the flexible cable has a polyimide matrix for thermal isolation of the heat spreader card and the circuit card.

6. The apparatus of claim 1, wherein the major surface of the heat spreader card and the major surface of the circuit card are disposed substantially perpendicular with respect to one another.

7. The apparatus of claim 6, wherein the flexible cable electrically connects the optical transducing subassembly on the major surface of the heat spreader to the circuit card.

8. The apparatus of claim 7, and further comprising:
   a hot bar attachment between the flexible cable and the circuit card.

9. The apparatus of claim 8, wherein the flexible cable connects directly to the optical subassemblies and provides a controlled impedance signal path between electronic circuitry on the circuit card.

10. The apparatus of claim 9, wherein the flexible cable has a polyimide matrix for thermal isolation of the heat spreader card and the circuit card.

11. The apparatus of claim 1, wherein the flexible cable provides a controlled impedance signal path between electronic circuitry on the circuit card to the optical subassemblies.

12. An attachment mechanism for the electrical connection of electronics to optical devices, comprising:

a heat spreader card having a major surface supporting the optical devices and an opposite surface;

a circuit card having a major surface supporting the electronics; and at least a first flexible cable directly attached between the major surface of the circuit card, through a slot in the heat spreader card from the opposite surface of the heat spreader card to the major surface of the heat spreader card and providing the sole direct mechanical attachment between the circuit card and the heat spreader card.

13. The attachment mechanism of claim 12, wherein the flexible cable includes electrical conductors held positionally in a polyimide matrix, which in turn provides for thermal isolation of the heat spreader card and the circuit card.

14. The attachment mechanism of claim 13, wherein the major surfaces are substantially perpendicular to one another.

* * * * *

UNITED STATES PATENT AND TRADEMARK OFFICE
CERTIFICATE OF CORRECTION

PATENT NO. : 5,513,073
DATED : April 30, 1996
INVENTOR(S) : *Block et al*

It is certified that error appears in the above-indentified patent and that said Letters Patent is hereby corrected as shown below:

On the title page, item
Ref. [22] Filed: change file date from "Apr. 28, 1994" to
--Apr. 18, 1994--

In the drawings: substitute one of two Figure 2 drawings and replace with <u>Figure 1</u>

Signed and Sealed this

Sixth Day of August, 1996

*Attest:*

BRUCE LEHMAN

*Attesting Officer*    Commissioner of Patents and Trademarks